United States Patent
Yang et al.

(10) Patent No.: US 9,646,707 B1
(45) Date of Patent: May 9, 2017

(54) DATA STORAGE DEVICE AND OPERATING METHOD THEREOF

(71) Applicant: SK hynix Inc., Gyeonggi-do (KR)

(72) Inventors: Chan Woo Yang, Gyeonggi-do (KR); Jong Won Park, Gyeonggi-do (KR); Ju Hyeon Han, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/240,810

(22) Filed: Aug. 18, 2016

(30) Foreign Application Priority Data

Mar. 28, 2016 (KR) .................. 10-2016-0036932

(51) Int. Cl.
*G11C 16/10* (2006.01)
*G11C 16/26* (2006.01)
*G11C 16/08* (2006.01)
*G11C 16/16* (2006.01)

(52) U.S. Cl.
CPC .............. *G11C 16/26* (2013.01); *G11C 16/08* (2013.01); *G11C 16/10* (2013.01); *G11C 16/16* (2013.01)

(58) Field of Classification Search
CPC ................................ G11C 16/10; G11C 16/08
USPC ......................................... 365/185.11, 185.24
See application file for complete search history.

(56) References Cited

U.S. PATENT DOCUMENTS

| | | | | |
|---|---|---|---|---|
| 5,966,327 A * | 10/1999 | Jo | ........................ | G11C 17/12 365/185.11 |
| 6,160,749 A * | 12/2000 | Pinkham | ................ | G11O 5/145 365/189.02 |
| 7,369,433 B2 * | 5/2008 | Toda | ................... | G11C 11/5642 365/185.03 |
| 7,440,327 B1 * | 10/2008 | Sekar | ................. | G11C 16/3418 365/185.17 |
| 7,545,678 B2 * | 6/2009 | Lee | ...................... | G11C 11/5628 365/185.17 |
| 7,719,888 B2 * | 5/2010 | Han | ..................... | G11C 11/5642 365/185.02 |
| 8,139,409 B2 * | 3/2012 | Chevallier | .............. | G11C 11/21 365/185.05 |
| 8,654,562 B2 * | 2/2014 | Deng | .................... | G11C 11/412 365/148 |
| 8,923,060 B2 * | 12/2014 | Shim | ...................... | G11C 16/30 365/185.17 |
| 9,349,479 B1 * | 5/2016 | Sehgal | ............... | G11C 16/3427 |
| 9,355,724 B2 * | 5/2016 | Oh | ...................... | G11C 16/0483 |
| 9,490,007 B1 * | 11/2016 | Chan | .................... | G11C 11/419 |

FOREIGN PATENT DOCUMENTS

| KR | 100874911 | 12/2008 |
|---|---|---|
| KR | 1020150014702 | 2/2015 |

* cited by examiner

*Primary Examiner* — Michael Tran
(74) *Attorney, Agent, or Firm* — IP & T Group LLP

(57) ABSTRACT

A data storage device includes a nonvolatile memory device including a nonvolatile memory device including a plurality of memory blocks each having a plurality of memory cells and a controller suitable for determining whether a target memory block for a read operation among the memory blocks is an open block, adjusting a pass bias to be applied to unselected memory cells during the read operation for the target memory block, according to a result of the determination, and controlling the nonvolatile memory device to perform the read operation using the adjusted pass bias.

18 Claims, 8 Drawing Sheets

US 9,646,707 B1

DATA STORAGE DEVICE AND OPERATING METHOD THEREOF

CROSS-REFERENCES TO RELATED APPLICATION

The present application claims priority under 35 U.S.C. §119(a) to Korean application number 10-2016-0036932, filed on Mar. 28, 2016, in the Korean Intellectual Property Office, which is incorporated herein by reference in its entirety.

BACKGROUND

1. Technical Field

Various embodiments of the present invention relate generally to a data storage device and, more particularly, to a data storage device including a nonvolatile memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices can be embedded in external devices or fabricated separately and then connected afterwards.

SUMMARY

In an embodiment, a data storage device may include: a nonvolatile memory device including a plurality of memory blocks each having a plurality of memory cells; and a controller suitable for determining whether a target memory block for a read operation among the memory blocks is an open block, adjusting a pass bias to be applied to unselected memory cells during the read operation for the target memory block, according to a result of the determination, and controlling the nonvolatile memory device to perform the read operation using the adjusted pass bias.

In an embodiment, an operating method of a data storage device may include: determining whether a target memory block among a plurality of memory blocks of a nonvolatile memory device for which a read operation is to be performed is an open block; adjusting a pass bias to be applied to unselected memory cells among a plurality of memory cells included in the target memory block during the read operation, according to a result of the determining; and controlling the nonvolatile memory device to perform the read operation using the adjusted pass bias.

BRIEF DESCRIPTION OF THE DRAWINGS

The present invention will now be described in reference to the following drawings, in which.

DETAILED DESCRIPTION

Figure 1:
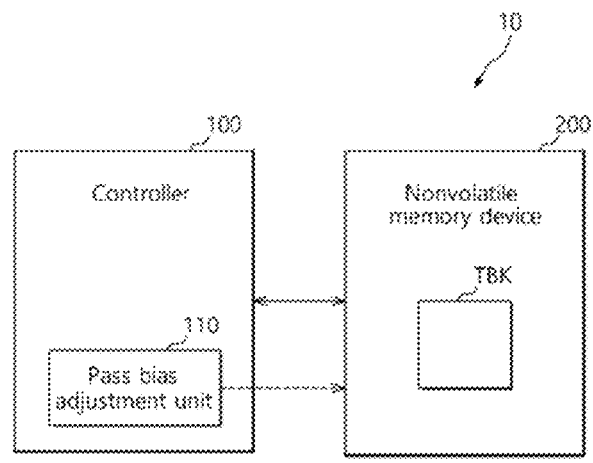
FIG. 1 is a simplified diagram illustrating a data storage device, according to an embodiment of the present invention.

Hereinafter, various embodiments of the present invention including a data storage device and an operating method thereof will be described with reference to the accompanying drawings. The present invention may, however, be embodied in different forms and should not be construed as being limited to the embodiments set forth herein. Rather, these embodiments are provided for describing the present invention in sufficient detail so that a person skilled in the art to which the invention pertains can make and use the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It is also noted, that in some instances, as would be apparent to those skilled in the art to which this invention pertains, a feature or element described in connection with one embodiment may be used singly or in combination with other features or elements of another embodiment, unless otherwise specifically indicated.

Referring now to FIG. 1, a data storage device 10 is provided, according to an embodiment of the present invention.

According to the embodiment of FIG. 1, the data storage device 10 may be configured to store, in response to a write request from an external device (not shown), data provided from the external device. Also, the data storage device 10 may be configured to provide stored data to the external device, in response to a read request from the external device.

The data storage device 10 may be configured as one of a Personal Computer Memory Card International Association (PCMCIA) card, a Compact Flash (CF) card, a smart media card, a memory stick, various multimedia cards (e.g., MMC, eMMC, RS-MMC, and MMC-Micro), various secure digital cards (e.g., SD, Mini-SD, and Micro-SD), a Universal Flash Storage (UFS), a Solid State Drive (SSD) and the like.

The data storage device 10 may include a controller 100 and a nonvolatile memory device 200.

The controller 100 may control the operations of the data storage device 10. For example, the controller 100 may store data in the nonvolatile memory device 200, in response to a write request received from the external device. Also, for example, the controller 100 may read data stored in the nonvolatile memory device 200 and output the read data to the external device, in response to a read request received from the external device.

The controller 100 may determine, before controlling the nonvolatile memory device 200 to perform a read operation for a target memory block TBK, whether the target memory block TBK is an open block, and perform a pass bias adjustment operation according to a result of the determination. The pass bias adjustment operation adjusts a pass bias applied to unselected memory cells during a read operation for the target memory block TBK. The controller 100 controls the nonvolatile memory device 200 for performing the read operation using the adjusted pass bias.

More specifically, the controller 100 performs the pass bias adjustment operation when the target memory block TBK is an open block. The open block may be a memory block which has only part of its memory cells written with data and may be used for storing new data received from a host. The controller 100 does not perform the pass bias adjustment operation when the target memory block TBK is a closed block. A closed block may have all its memory cells written with data and hence may not be used for storing new data received from a host. An open block may be converted into a closed block by having no longer an empty memory region (e.g., a page) which can be written.

The data storage device 10 includes a pass bias adjustment unit 110 configured to perform the pass bias adjustment operation. For example, as illustrated in the embodiment of FIG. 1, controller 100 may include a pass bias adjustment unit 110 configured to perform the pass bias adjustment operation. Controller 100 which includes a pass bias adjustment unit 110 may also be referred to herein after as a pass controller.

The pass bias adjustment unit 110 may calculate an adjustment index for the target memory block TBK and adjust a pass bias based on the adjustment index.

For example, the pass bias adjustment unit 110 may calculate an adjustment index based on the number of erased word lines among a plurality of word lines of the target memory block TBK. The erased word lines may be word lines of which all corresponding memory regions are not yet written.

According to an embodiment, the pass bias adjustment unit 110 may calculate an adjustment index, based on the number of erased memory regions among memory regions included in the target memory block TBK.

The pass bias adjustment unit 110 may adjust the pass bias to a level less than a default pass bias so that the level of the pass bias becomes smaller as the adjustment index of the target memory block TBK increases.

According to an embodiment, the pass bias adjustment unit 110 may adjust the pass bias to a low threshold level corresponding to the adjustment index. The low threshold level may be a minimum bias level capable of turning on unselected memory cells of the target memory block TBK.

According to an embodiment, the pass bias adjustment unit 110 may select, among a plurality of ranges corresponding to a plurality of bias levels, a range in which the adjustment index is included, and may adjust the pass bias to a bias level corresponding to the selected range. In this regard, as the plurality of ranges include higher adjustment indexes, the plurality of ranges correspond to lower bias levels. According to an embodiment, each of the bias levels may be a low threshold level corresponding to the minimum adjustment index of a corresponding range.

The nonvolatile memory device 200 may store data transmitted from the controller 100, may read stored data and transmit the read data to the controller 100, according to control of the controller 100.

The nonvolatile memory device 200 may perform a read operation for a target memory block TBK according to control of the controller 100. In the read operation for the target memory block TBK, if a pass bias adjustment operation of the controller 100 is not performed, the nonvolatile memory device 200 performs the read operation using a default pass bias. However, if a pass bias adjustment operation of the controller 100 is performed, the nonvolatile memory device 200 then performs the read operation using a pass bias adjusted by the controller 100. As described above, whether or not a pass bias adjustment operation is performed, depends upon whether or not the target memory bock is an open or a closed memory block.

The nonvolatile memory device 200 may be or include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

Figure 2:
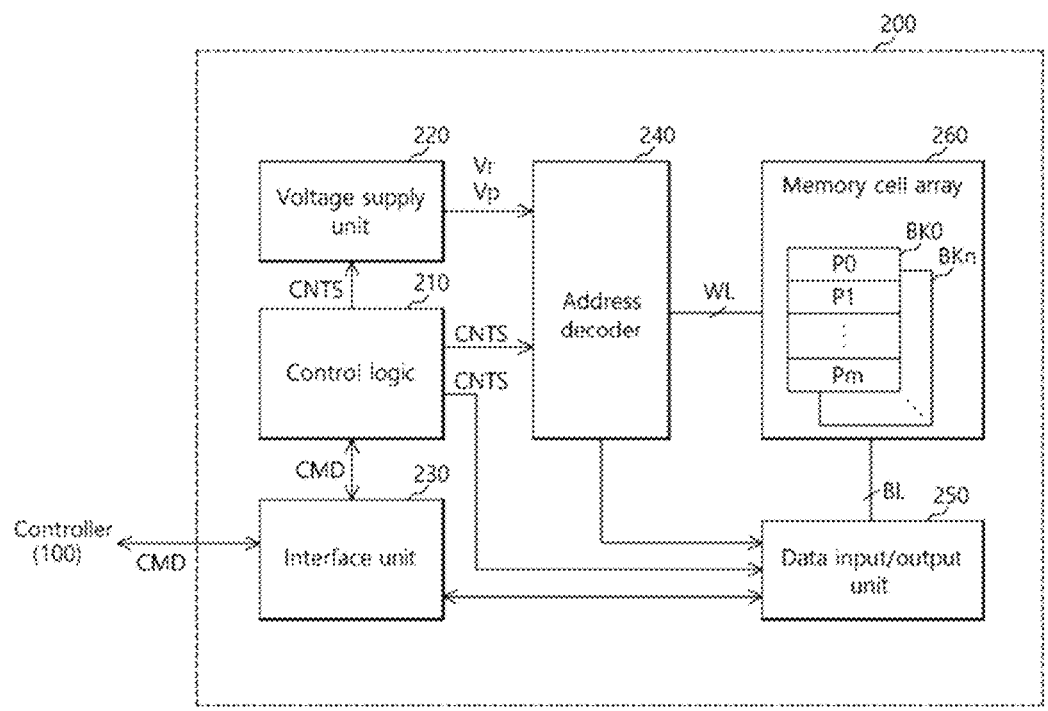
FIG. 2 is a more detailed diagram illustrating an example of a detailed configuration of the nonvolatile memory device of FIG. 1.

Referring now to FIG. 2 an example is provided of a detailed configuration of the nonvolatile memory device 200 of FIG. 1.

According to FIG. 2, the nonvolatile memory device 200 may include a control logic 210, a voltage supply unit 220, an interface unit 230, an address decoder 240, a data input/output unit 250, and a memory cell array 260.

The control unit 210 may control the operations of the nonvolatile memory device 200 according to control of the controller 100. The control logic 210 may receive, through the interface unit 230, a command CMD received from the controller 100, and transmit control signals CNTS to internal units of the nonvolatile memory device 200 in response to the command.

The voltage supply unit 220 may generate various operating voltages required for general operations of the nonvolatile memory device 200, according to a control signal CTNS received from the control logic 210. The voltage supply unit 220 may supply a pass bias Vp and a read bias Vr for a read operation to the address decoder 240.

The interface unit 230 may exchange data and various control signals including commands and addresses with the controller 100. For example, the interface unit 230 may transmit various inputted control signals and data received to the internal units of the nonvolatile memory device 200.

The address decoder 240 may decode an address received from the controller to select a portion to be accessed from the memory cell array 260.

The address decoder 240 may selectively drive word lines WL according to a result of decoding. The address decoder 240 may apply the read bias Vr to a target word line of a target memory block among memory blocks BK0 to BKn, and apply the pass bias Vp to unselected word lines of the target memory block.

The address decoder 240 may control the data input/output unit 250 to selectively drive bit lines BL.

The data input/output unit 250 may transmit data received through the interface unit 230, to the memory cell array 260 through the bit lines BL. The data input/output unit 250 may transmit data read from the memory cell array 260 through the bit lines BL, to the Interface unit 230. The data input/ output unit 250 may sense current generated as memory cells included in the memory cell array 260 are turned on/off in response to the read bias Vr, and acquire data read from the memory cell according to a result of the current sensing.

The memory cell array 260 may be coupled with the address decoder 240 through the word lines WL. The memory cell array 260 may also be coupled with the data input/output unit 250 through the bit lines BL. The memory cell array 260 may include a plurality of memory blocks BK0 to BKn. Each of the memory blocks BK0 to BKn may include a plurality of pages P0 to Pm.

Figure 3:
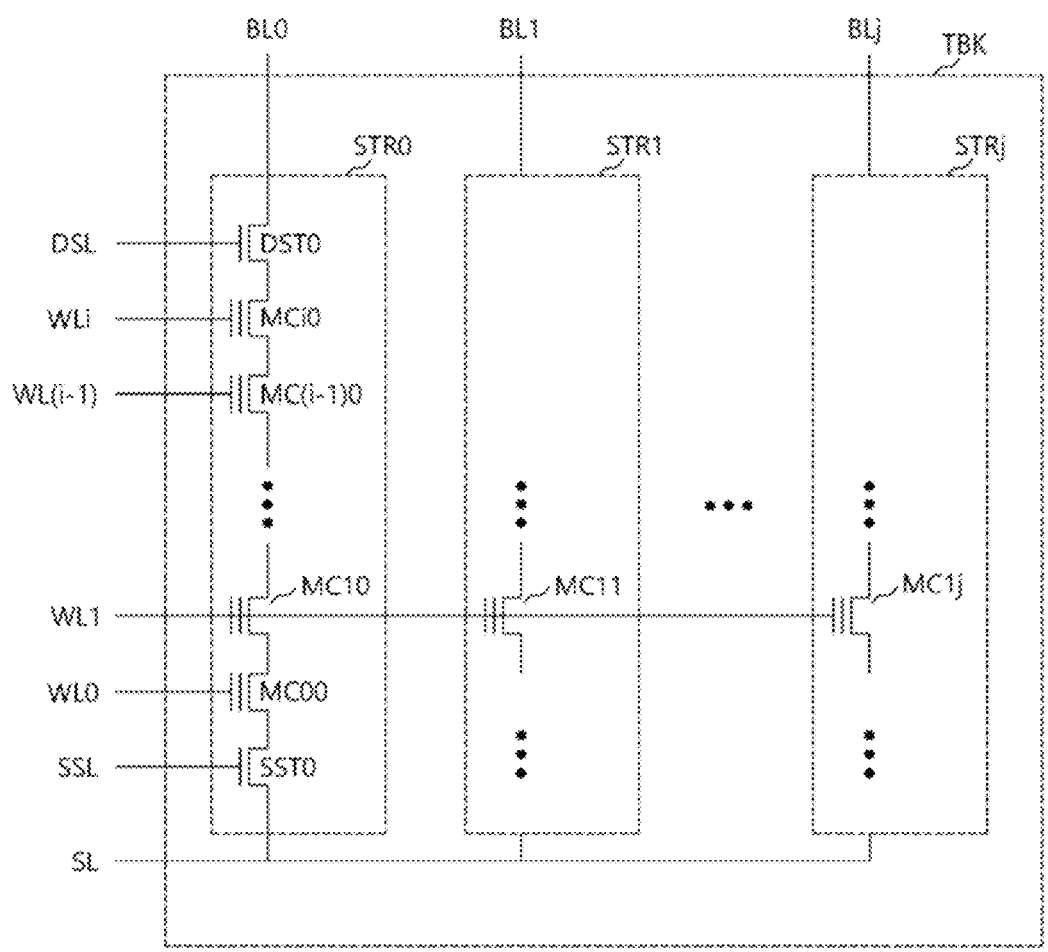
FIG. 3 is a diagram illustrating in detail an example of a detailed configuration of a target memory block.

FIG. 3 illustrates in more detail an example of a configuration of a target memory block TBK. Each of the memory blocks BK0 to BKn shown in FIG. 2 may have substantially the same configuration as that of the target memory block TBK of FIG. 3.

According to the embodiment of FIG. 3, the target memory block TBK may include a plurality of strings STR0 to STRj. Each of the strings STR0 to STRj may be coupled between a source line SL and a corresponding bit line. For example, the string STR0 may be coupled between the source line SL and a bit line BL0. The source line SL is commonly shared between all the strings STR0 to STRj.

Each of the strings STR0 to STRj may have substantially the same configuration as that of the string STR0, and thus the string STR0 will be described herein as an example. As illustrated in the embodiment of FIG. 3, the string STR0 may include a drain select transistor DST0, memory cells MC00 to MCi0, and a source select transistor SST0. A drain of the drain select transistor DST0 may be coupled to the bit line BL0, and a gate thereof may be coupled to a drain select line DSL. A source of the source select transistor SST0 may be coupled to the source line SL, and a gate thereof may be coupled to a source select line SSL. The memory cells MC00 to MCi0 may be coupled in series between the source select transistor SST0 and the drain select transistor DST0. Gates of the memory cells MC00 to MCi0 may be respectively coupled to word lines WL0 to WLi.

Each of the word lines WL0 to WLi may be coupled to corresponding memory cells of the strings STR0 to STRj. For example, the word line WL1 may be coupled to memory cells MC10 to MC1j included in the respective strings STR0 to STRj. Each memory cell may be accessed as the corresponding word line is selected. For example, the memory cells MC10 to MC1j may be simultaneously written or read as the word line WL1 is selected.

According to the number of data bits stored in each memory cell, the word line may correspond to a plurality of pages. For example, when one bit is stored in each memory cell, the word line may correspond to one page. When two bits (i.e., Least Significant Bit (LSB) and Most Significant Bit (MSB) data), are stored in each cell, the word line may correspond to LSB and MSB pages in which LSB and MSB data are respectively stored. Hereinafter, it will be assumed, for illustration purposes, that each memory cell stores two bits and hence each word line corresponds to a LSB page and a MSB page, however, the described embodiment is not limited to such configuration.

Figure 4:
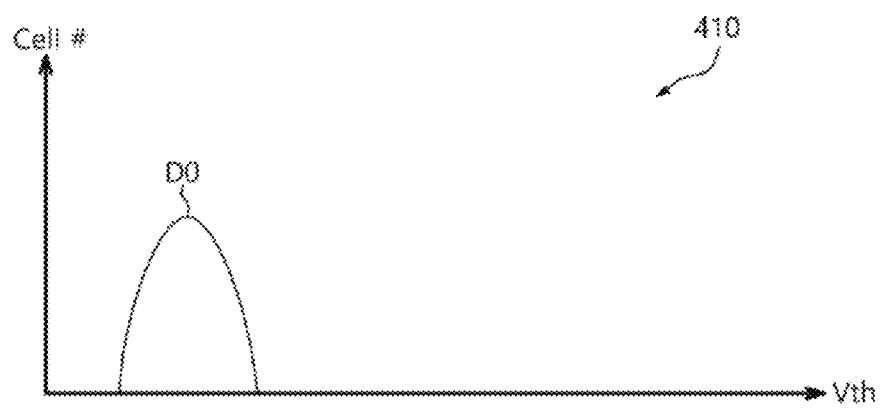
FIG. 4 illustrates examples of threshold voltage distributions of memory cells included in the target memory block, of FIG. 3.
Figure 4:
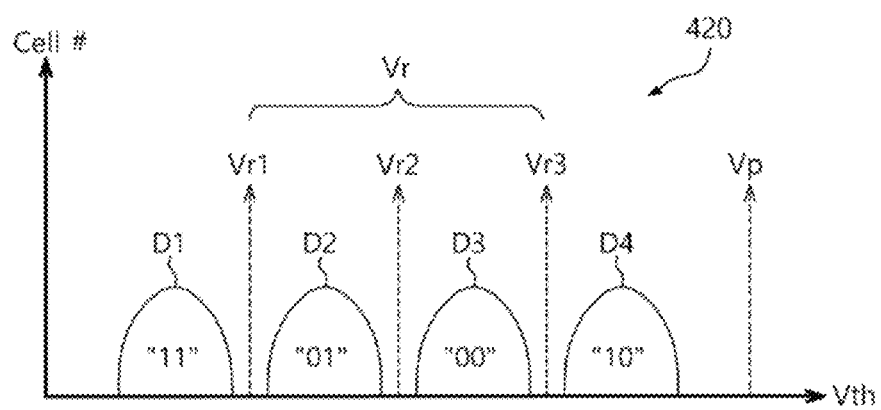

FIG. 4 is a diagram showing examples of threshold voltage distributions D1 to D4 of memory cells included in the target memory block TBK. The horizontal axis Vth represents a threshold voltage of a memory cell, and the vertical axis Cell # represents the number of memory cells for each threshold voltage.

According to the embodiment of FIG. 4, memory cells in the nonvolatile memory device 200 may form a threshold voltage distribution D0 when they have been erased (410). The memory cells may form predetermined threshold voltage distributions D1 to D4 according to stored data (420). A memory cell may be controlled to have a threshold voltage corresponding to any one of the four threshold voltage distributions D1 to D4 representing a two-bit data stored when the memory cell is written.

For example, as illustrated in FIG. 4, a memory cell in which data "11" is stored has a threshold voltage corresponding to the threshold voltage distribution D1, a memory cell in which data "01" is stored has a threshold voltage corresponding to the threshold voltage distribution D2, a memory cell in which data "00" is stored has a threshold voltage distribution corresponding to the threshold voltage distribution D3, and a memory cell in which data "10" is stored has a threshold voltage distribution corresponding to the threshold voltage distribution D4.

A memory cell may be turned on/off depending on a threshold voltage when a predetermined read bias Vr is applied thereto through a corresponding word line. For example, a memory cell may be turned on when a read bias Vr greater than its own threshold voltage is applied thereto, and may be turned off when a read bias Vr less than its own threshold voltage is applied thereto. Whether the threshold voltage of a memory cell is greater or less than a read bias Vr may be determined by sensing current formed when the memory cell is turned on/off. Therefore, the threshold voltage distribution corresponding to the memory cell may be determined, based on read biases Vr1 to Vr3 disposed between the threshold voltage distributions D1 to D4. As a result, data corresponding to the threshold voltage distribution may be read from the memory cell.

In more detail, when performing a read operation for a target page included in the target memory block TBK, the nonvolatile memory device 200 may apply a read bias Vr to a target word line corresponding to the target page, and apply a pass bias Vp to unselected word lines, that is, the other word lines of the target memory block TBK except the target word line. The pass bias Vp may correspond to a level greater than the highest threshold voltage distribution D4 among the threshold voltage distributions D1 to D4 on the threshold voltage axis Vth. The reason for this is because all of the unselected memory cells coupled to the unselected word lines should be turned on in order to sense current generated as the target memory cells coupled to the target word line are turned on/off. That is, the pass bias Vp should be of a sufficiently high level to turn on all of the unselected memory cells when the pass bias Vp is applied to the unselected word lines.

Figure 5:
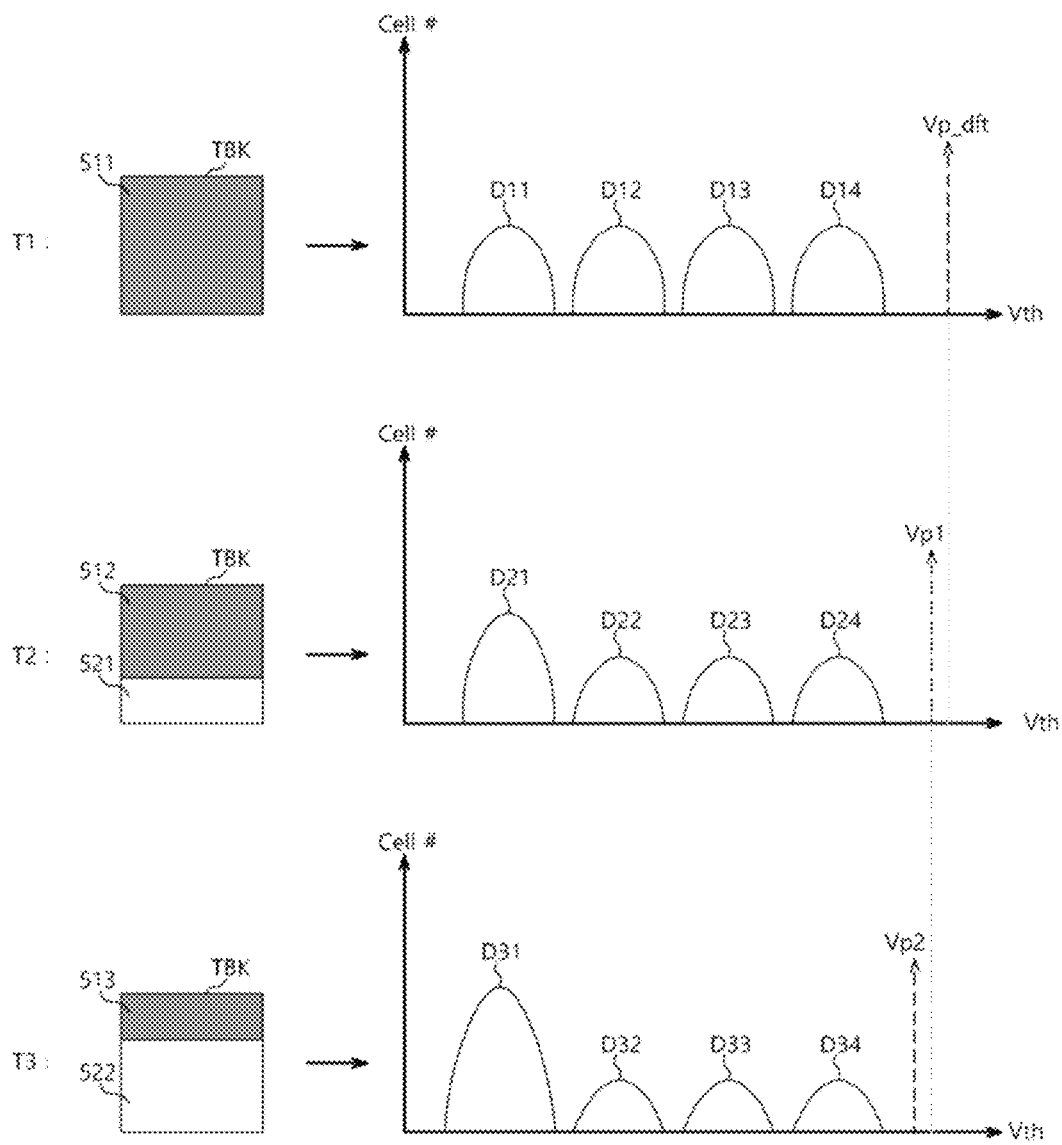
FIG. 5 is a diagram illustrating an example of a pass bias adjustment operation of a pass bias adjustment unit of the data storage device of FIG. 1.

FIG. 5 is a diagram illustrating an example of a pass bias adjustment operation of the pass bias adjustment unit 110 of FIG. 1.

According to the embodiment of FIG. 5, shaded portions 511-513 of the target memory block TBK may represent that it has been written, and the other portions thereof 521-522 may represent an erased state. At states T1 to T3, the pass bias Vp may be adjusted depending on the degree with which the target memory block TBK is written.

In detail, state T1 represents a case when memory block TBK has no longer an empty page. In this case, if data is randomly (i.e., uniformly) stored in the target memory block TBK, the threshold voltage distributions D11 to D14 of the memory cells of the target memory block TBK may be uniformly formed. When a read operation is performed, a default pass bias Vp_dft capable of turning on all unselected memory cells may be applied. The default pass bias Vp_dft may be a default value which is used when the pass bias adjustment operation is not performed.

State T2 represents a case when memory block TBK includes empty pages corresponding to ⅓ of the total number of pages in the memory block. Therefore, because memory cells of an erased state (521) are present, the threshold voltage distribution D21 may be relatively wider than the threshold voltage distributions D22 to D24. In this case, because the threshold voltages of the memory cells are generally less than those of state T1, the pass bias Vp1 may turn on all unselected memory cells even if the pass bias Vp1 is less than the pass bias Vp_dft.

State T3 represents a case when memory block TBK includes empty pages corresponding ⅔ of the total number of pages of the target memory block. Therefore, because the number of memory cells of an erased state (522) is greater than that of state T2, the threshold voltage distribution D31 may be larger, and the threshold voltage distributions D32 to D34 may be smaller. In this case, because the threshold voltages of the memory cells are generally less than those of state T2, the pass bias Vp2 may turn on all unselected memory cells even if the pass bias Vp2 is less than the level of the pass bias Vp1.

According to an embodiment, data corruption resulting from a read disturb effect caused by a high pass bias Vp may be prevented by lowering the pass bias Vp through the pass bias adjustment operation depending on the degree with which the target memory block TBK is written. Therefore, data reliability may be enhanced.

Figure 6:
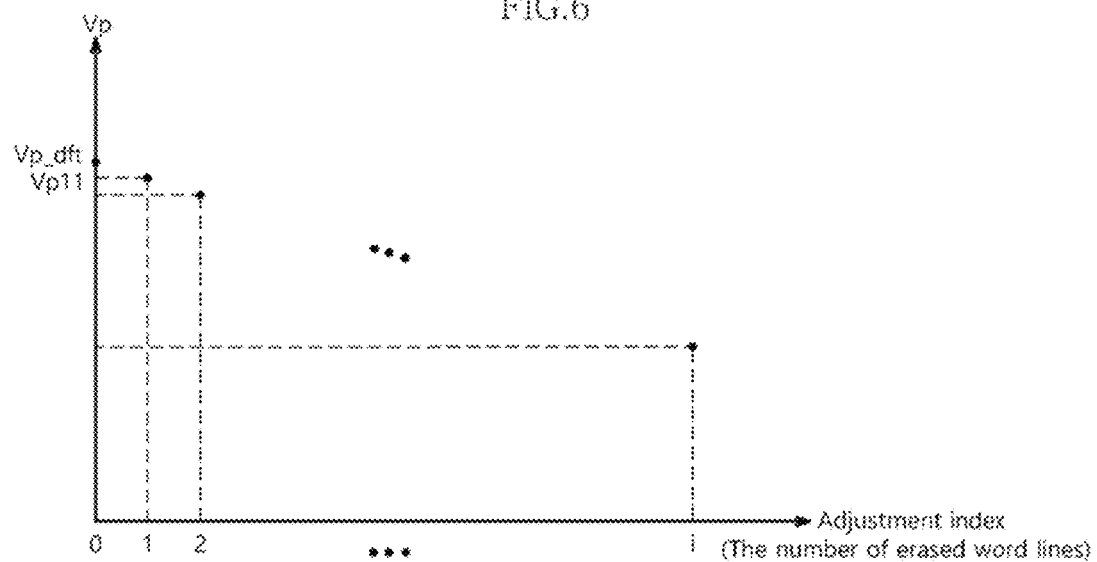
FIGS. 6 and 7 are diagrams illustrating examples of a method of adjusting a pass bias based on an adjustment index.
Figure 7:
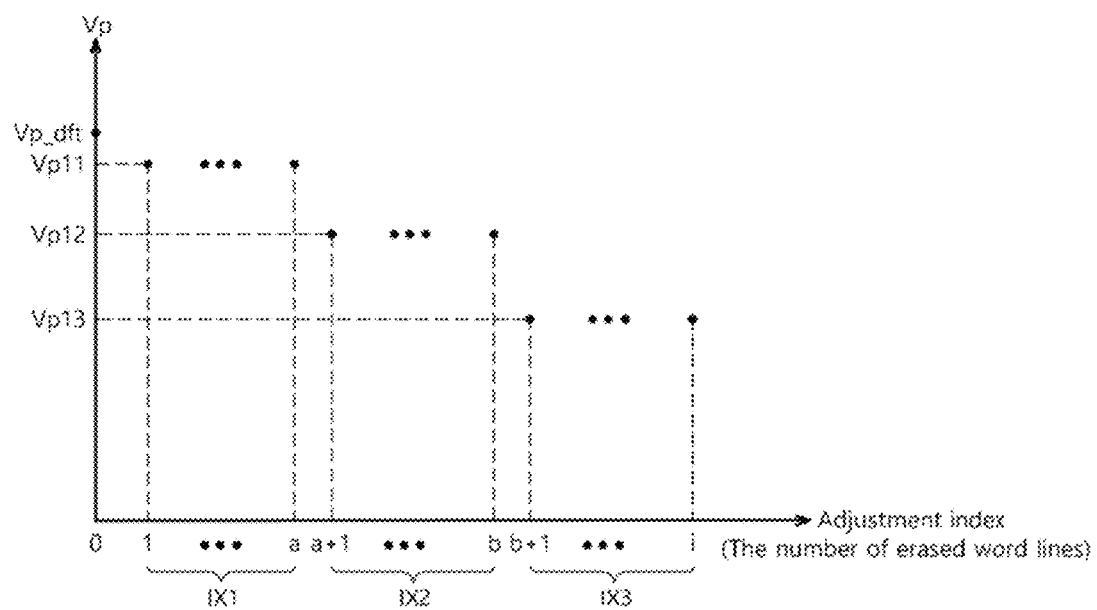

FIGS. 6 and 7 illustrate examples of a method of adjusting the pass bias Vp based on an adjustment index.

In FIGS. 6 and 7, it is assumed that the pass bias adjustment unit 110 of FIG. 1 calculates, among the plurality of word lines WL0 to WLi of the target memory block TBK, the number of erased word lines as the adjustment index. The erased word lines are word lines for which all corresponding pages are not yet written.

According to the embodiment of FIG. 6, the pass bias adjustment unit 110 may adjust the pass bias Vp to a lower level as the adjustment index of the target memory block TBK increases, that is, as the number of erased word lines increases. For example, when the number of erased word lines of the target memory block TBK is "1", the pass bias Vp may be lowered to be the pass bias Vp11 by a predetermined level from the default pass bias Vp_dft.

To turn on all unselected memory cells, the pass bias Vp may have to be a predetermined low threshold level or more. The low threshold level may differ depending on the adjustment index of the target memory block TBK. That is, the higher the adjustment index, the lower the low threshold level of the pass bias Vp may be. Consequentially, a low threshold level corresponding to each of the values 1 to i of the adjustment index may be determined. The low threshold level may be the minimum bias level of the pass bias Vp capable of turning on all unselected memory cells in the target memory block TBK by which a corresponding adjustment index is calculated.

Therefore, the pass bias Vp may be adjusted to a level that is equal to or greater than the low threshold level corresponding to the adjustment index of the target memory block TBK. According to an embodiment, for minimizing the read disturb effect, the pass bias Vp may be adjusted to the low threshold level corresponding to the adjustment index of the target memory block TBK.

According to the embodiment of FIG. 7, unlike FIG. 6, the pass bias adjustment unit 110 may select, among ranges IX1 to IX3, a range in which the adjustment index of the target memory block TBK is included, and may adjust the pass bias Vp to a bias level corresponding to the selected range. In this regard, the ranges IX1 to IX3 may respectively correspond to bias levels Vp11, Vp12 and Vp13, and may correspond to lower levels as they include higher adjustment indexes. For example, the range IX2 may include adjustment indexes (a+1) to b greater than adjustment indexes 1 to a included in the range IX1 and correspond to the bias level Vp12 which is less than the bias level Vp11 corresponding to the range IX1.

In FIG. 7, the bias levels Vp11, Vp12 and Vp13 may have to be set so that each is equal to or greater than a low threshold level corresponding to the minimum adjustment index of the corresponding range. So long as the pass bias Vp is equal to or greater than a low threshold level corresponding to the minimum adjustment index "1" of the range IX1, all unselected memory cells can be turned on even if the adjustment index of the target memory block TBK is any value of the range IX1.

According to an embodiment, to minimize the read disturb effect, each of the bias levels Vp11, Vp12 and Vp13 may be a low threshold level corresponding to the minimum adjustment index of the corresponding range.

Although only three ranges IX1 to IX3 have been illustrated in FIG. 7, it is noted that the number of ranges may differ.

Although, in FIG. 7, the range IX1 has been illustrated as corresponding to the bias level Vp11 which is less than the default pass, it is noted that the bias Vp_dft, the range IX1 may correspond to the default bias Vp_dft in some embodiments.

Although, in FIGS. 6 and 7, the adjustment index has been illustrated as being calculated based on the number of erased word lines of the target memory block TBK, in another embodiment, the adjustment index may be calculated based on the number of erased pages among pages included in the target memory block TBK.

According to an embodiment, two or more pass biases may be used during a read operation. For example, when performing a read operation, the nonvolatile memory device 200 may apply, to word lines adjacent to the target word line, a second pass bias greater than a first pass bias which is applied to the other unselected word lines. In this case, the pass bias adjustment unit 110 may adjust the first pass bias according to the above-mentioned operating method, and adjust the second pass bias by the same change amount as that of the first pass bias.

Figure 8:
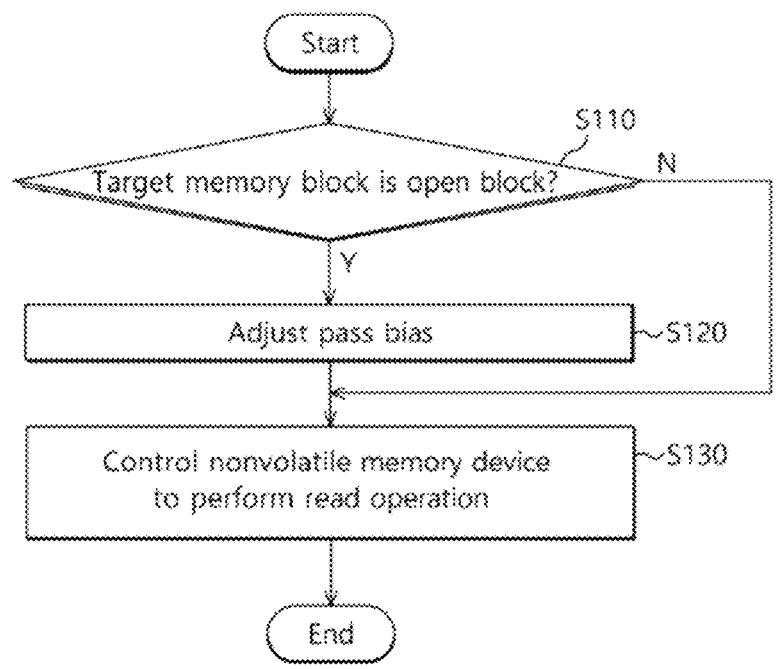
FIG. 8 is a flowchart of an operating method of the data storage device of FIG. 1, according to an embodiment of the present invention.

FIG. 8 is a flowchart of an operating method of the data storage device 10 of FIG. 1, according to an embodiment of the present invention.

According to the embodiment of FIG. 8, at step S110, the controller 100 may determine whether the target memory block TBK for which a read operation is to be performed is an open block. When the target memory block TBK is an open block, the process may move to step S120. When the target memory block TBK is not an open block, the process may move to step S130.

At step S120, the controller 100 may adjust a pass bias to be applied to unselected memory cells during the read operation for the target memory block TBK. The controller 100 may control the nonvolatile memory device 200 to perform the read operation using the adjusted pass bias.

At step S130, the controller 100 may control the nonvolatile memory device 200 to perform the read operation for the target memory block TBK.

Figure 9:
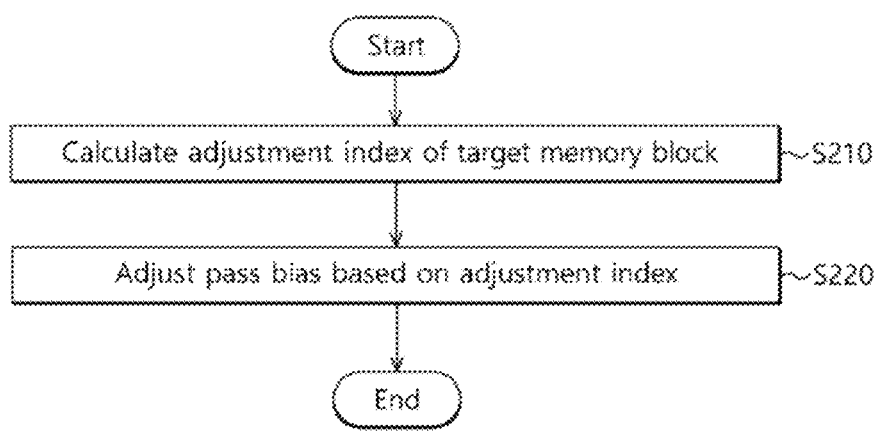
FIG. 9 is a flowchart of an operating method of the pass bias adjustment unit of FIG. 1, according to an embodiment of the present invention.

FIG. 9 is a flowchart illustrating an example of an operating method of the pass bias adjustment unit 110 of FIG. 1. The process shown in FIG. 9 may be an embodiment of step S120 of FIG. 8.

According to the embodiment of FIG. 9, at step S210, the pass bias adjustment unit 110 may calculate an adjustment index of the target memory block TBK. For example, the pass bias adjustment unit 110 may calculate the adjustment index based on the number of erased word lines among a plurality of word lines of the target memory block TBK. The erased word lines may be word lines of which all corresponding memory regions are not yet written. According to an embodiment, the pass bias adjustment unit 110 may calculate the adjustment index, based on the number of erased memory regions among memory regions included in the target memory block TBK.

At step S220, the pass bias adjustment unit 110 may adjust the pass bias based on the adjustment index. The pass bias adjustment unit 110 may adjust the pass bias to a level less than the default pass bias, so that the level of the pass bias becomes smaller as the adjustment index of the target memory block TBK increases. According to an embodiment, the pass bias adjustment unit 110 may adjust the pass bias to a low threshold level corresponding to the adjustment index. According to an embodiment, the pass bias adjustment unit 110 may select, among a plurality of ranges corresponding to a plurality of bias levels, a range in which the adjustment index is included, and may adjust the pass bias to a bias level corresponding to the selected range. As the plurality of ranges include higher adjustment indexes, the plurality of ranges correspond to lower bias levels. Each of the bias levels may be a low threshold level corresponding to the minimum adjustment index of a corresponding range.

Figure 10:
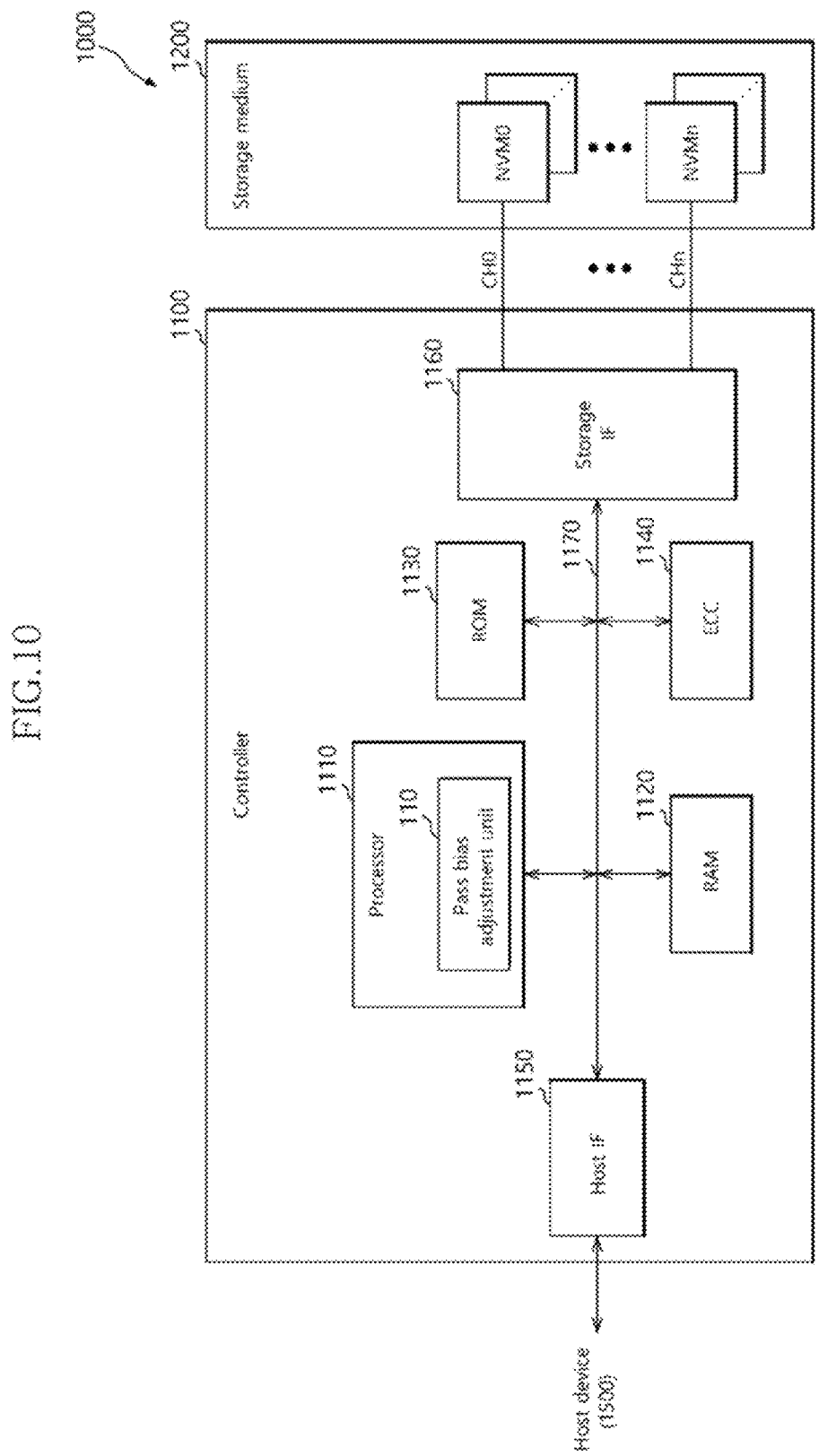
FIG. 10 is a simplified block diagram illustrating a solid state drive (SSD), according to an embodiment of the present invention.

FIG. 10 is a simplified block diagram illustrating a solid state drive (SSD) 1000, according to an embodiment of the present invention.

According to the embodiment of FIG. 10, the SSD 1000 may include a controller 1100 and a storage medium 1200.

The controller 1100 may control data exchange between a host device 1500 and the storage medium 1200. The controller 1100 may include a processor 1110, a random access memory (RAM) 1120, a read only memory (ROM) 1130, an error correction code (ECC) unit 1140, a host interface 1150, and a storage medium interface 1160.

The processor 1110 may control the operations of the controller 1100. The processor 1110 may store data in the storage medium 1200 and read stored data from the storage medium 1200, according to a data processing request from the host device 1500. In order to efficiently manage the storage medium 1200, the processor 1110 may control the internal operations of the SSD 1000, such as a merge operation, a wear leveling operation, and so forth.

The processor 1110 may include a pass bias adjustment unit 110 for performing an operation of a pass bias adjustment. That is, the processor 1110 may, via unit 110, determine, before controlling the nonvolatile memory device of the storage medium 1200 to perform a read operation for the target memory block, whether the target memory block is an open block, and perform a pass bias adjustment operation according to a result of the determination. The pass bias adjustment operation may be performed for adjusting a pass bias to be applied to unselected memory cells during the read operation for the target memory block. The processor 1110 may control the nonvolatile memory device so as to perform the read operation using the adjusted pass bias.

The RAM 1120 may store programs and program data to be used by the processor 1110. The RAM 1120 may temporarily store data received through the host interface 1150 before transferring them to the storage medium 1200, and may temporarily store data from the storage medium 1200 before transferring them to the host device 1500.

The ROM 1130 may store program codes to be read by the processor 1110. The program codes may include commands to be processed by the processor 1110 for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm.

The host interface 1150 may exchange data processing requests, data, etc. with the host device 1500.

The storage medium interface 1160 may transmit control signals and data to the storage medium 1200. The storage medium interface 1160 may receive data from the storage medium 1200. The storage medium interface 1160 may be coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may perform a write operation and a read operation according to the control of the controller 1100.

Figure 11:
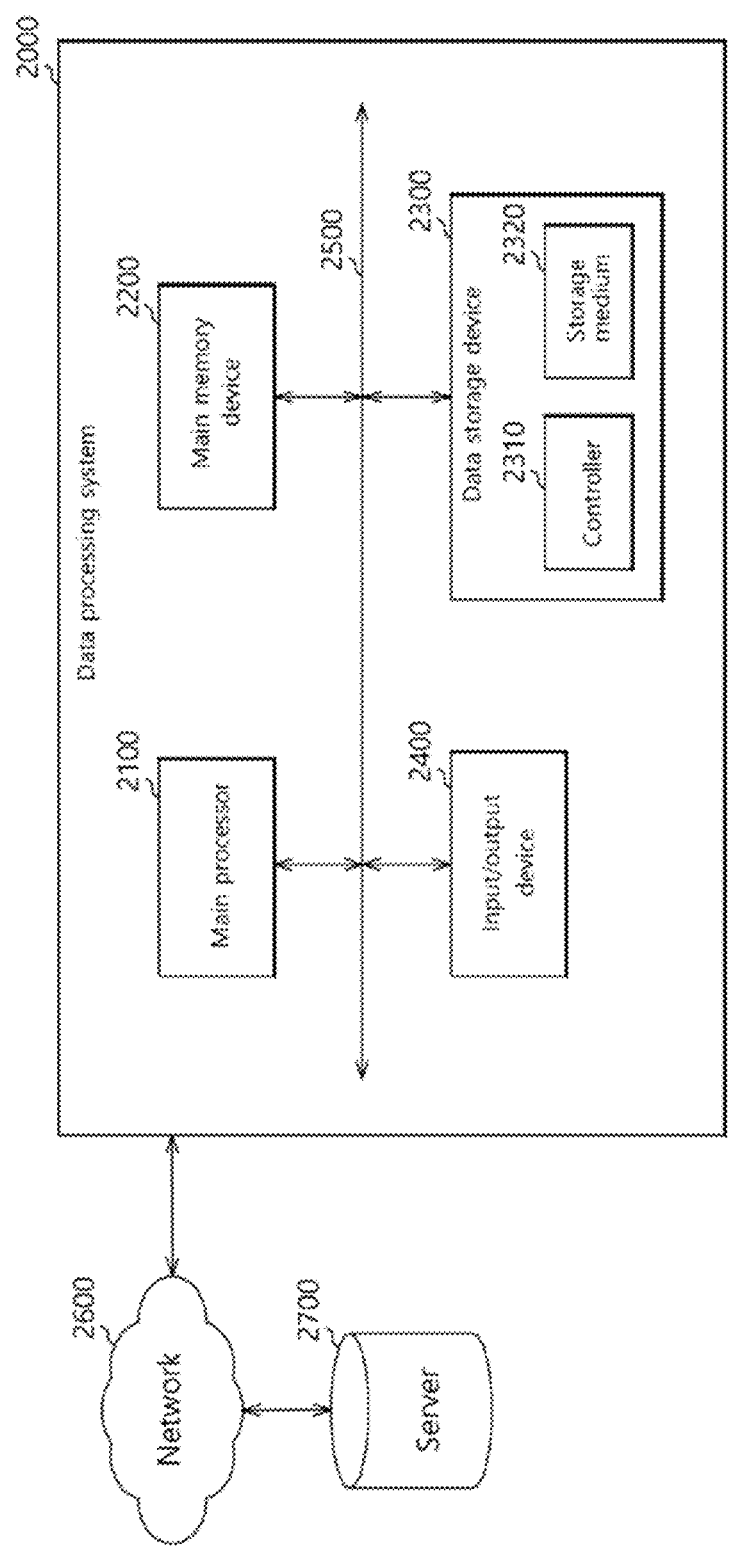
FIG. 11 is a simplified block diagram illustrating an example of a data processing system including a data storage device, according to an embodiment of the present invention.

FIG. 11 is a simplified block diagram illustrating a data processing system 2000 to which the data storage device 10 according to an embodiment of the invention.

The data processing system 2000 may include one of a computer, a laptop, a netbook, a smart phone, a digital television (TV), a digital camera, a navigator, etc. The data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control the operations of the data processing system 2000. For example, the main processor 2100 may be a central processing unit such as a microprocessor. The main processor 2100 may execute the software of an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate in a manner substantially similar to the data storage device 10 shown in FIG. 1.

The input/output device 2400 may include one of a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a local area network (LAN), a wide area network (WAN), a wireless network, and so on. The data processing system 2000 may include a network interface (not shown) to access the network 2600.

While various embodiments have been described above, it will be understood to those skilled in the art that the embodiments described are examples only. Accordingly, the data storage device and the operating method thereof described herein should not be limited based on the described embodiments. Many other embodiments and or variations thereof may be envisaged by those skilled in the relevant art without departing from the spirit and or scope of the present invention as defined in the following claims.

What is claimed is:

1. A data storage device comprising:
a nonvolatile memory device including a plurality of memory blocks each having a plurality of memory cells; and
a controller suitable for determining whether a target memory block for a read operation among the memory blocks is an open block, determining an adjustment index of the target memory block when it is determined that the target memory block is the open block, adjusting a pass bias to be applied to unselected memory cells during the read operation for the target memory block, based on the adjustment index, and controlling the nonvolatile memory device to perform the read operation using the adjusted pass bias.

2. The data storage device according to claim 1, wherein the controller determines the adjustment index, based on a number of erased word lines among a plurality of word lines of the target memory block.

3. The data storage device according to claim 1, wherein the controller determines the adjustment index, based on a number of erased memory regions among memory regions included in the target memory block.

4. The data storage device according to claim 1, wherein the controller adjusts the pass bias to a level less than a default pass bias.

5. The data storage device according to claim 4, wherein the controller adjusts the pass bias such that the level of the pass bias becomes smaller as the adjustment index increases.

6. The data storage device according to claim 1,
wherein the controller adjusts the pass bias to a low threshold level corresponding to the adjustment index, such that the low threshold level is a minimum bias level capable of turning on the unselected memory cells.

7. The data storage device according to claim 1, wherein the controller selects, among a plurality of ranges respectively corresponding to a plurality of bias levels, a range in which the adjustment index is included, and adjusts the pass bias to a bias level corresponding to the selected range.

8. The data storage device according to claim 7, wherein, as the ranges include higher adjustment indexes, the ranges correspond to lower bias levels.

9. The data storage device according to claim 7, wherein each of the bias levels is a low threshold level corresponding to a minimum adjustment index of a corresponding range.

10. An operating method of a data storage device, comprising:
determining whether a target memory block among a plurality of memory blocks of a nonvolatile memory device, for which a read operation is to be performed, is an open block;
determining an adjustment index of the target memory block when it is determined that the target memory block is the open block;
adjusting a pass bias to be applied to unselected memory cells among a plurality of memory cells included in the target memory block during the read operation based on the adjustment index; and
controlling the nonvolatile memory device to perform the read operation using the adjusted pass bias.

11. The operating method according to claim 10, wherein the determining of the adjustment index comprises:
determining the adjustment index, based on a number of erased word lines among a plurality of word lines of the target memory block.

12. The operating method according to claim 10, wherein the determining of the adjustment index comprises:
determining the adjustment index, based on a number of erased memory regions among a plurality of memory regions included in the target memory block.

13. The operating method according to claim 10, wherein the adjusting of the pass bias based on the adjustment index comprises:
adjusting the pass bias to a level less than a default pass bias.

14. The operating method according to claim 13, wherein the adjusting of the pass bias based on the adjustment index comprises:
adjusting the pass bias such that the level of the pass bias becomes smaller as the adjustment index increases.

15. The operating method according to claim 10,
wherein the adjusting of the pass bias based on the adjustment index comprises:
adjusting the pass bias to a low threshold level corresponding to the adjustment index, such that the low threshold level is a minimum bias level capable of turning on the unselected memory cells.

16. The operating method according to claim 10, wherein the adjusting of the pass bias based on the adjustment index comprises:
selecting, among a plurality of ranges respectively corresponding to a plurality of bias levels, a range in which the adjustment index is included; and
adjusting the pass bias to a bias level corresponding to the selected range.

17. The operating method according to claim 16, wherein, as the ranges include higher adjustment indexes, the ranges correspond to lower bias levels.

18. The operating method according to claim 16, wherein the bias level is a low threshold level corresponding to a minimum adjustment index of the selected range.

* * * * *